(12) United States Patent
Kimura et al.

(10) Patent No.: US 11,602,049 B2
(45) Date of Patent: Mar. 7, 2023

(54) CIRCUIT BOARD

(71) Applicant: TYCO ELECTRONICS JAPAN G.K., Kawasaki (JP)

(72) Inventors: Makiya Kimura, Kawasaki (JP); Satoshi Yamaga, Kawasaki (JP); Yohichi Sasaki, Kawasaki (JP)

(73) Assignee: TYCO ELECTRONICS JAPAN G.K., Kawasaki (JP)

( * ) Notice: Subject to any disclaimer, the term of this patent is extended or adjusted under 35 U.S.C. 154(b) by 0 days.

(21) Appl. No.: 17/397,382

(22) Filed: Aug. 9, 2021

(65) Prior Publication Data
US 2022/0053642 A1 Feb. 17, 2022

(30) Foreign Application Priority Data
Aug. 13, 2020 (JP) .............................. JP2020-136680

(51) Int. Cl.
*H05K 1/11* (2006.01)
*H01R 12/72* (2011.01)

(52) U.S. Cl.
CPC ........... *H05K 1/117* (2013.01); *H01R 12/721* (2013.01); *H05K 2201/098* (2013.01); *H05K 2201/09145* (2013.01)

(58) Field of Classification Search
CPC ................................. H05K 1/117; H01R 12/72
See application file for complete search history.

(56) References Cited

U.S. PATENT DOCUMENTS

| 4,298,237 A | 11/1981 | Griffith et al. |
| 2008/0089041 A1 | 4/2008 | Aruga |
| 2016/0249454 A1 | 8/2016 | Berman |

FOREIGN PATENT DOCUMENTS

| CN | 1278460 C | * 10/2006 | ............. H05K 1/117 |
| JP | S49139552 U | 12/1974 | |
| JP | 3894774 B2 | 3/2007 | |
| WO | 2009025059 A1 | 2/2009 | |
| WO | 2019152937 A1 | 2/2019 | |

OTHER PUBLICATIONS

Machine Translation of CN 1278460 C; Eguchi et al. Oct. 2006 (Year: 2006).*
Extended European Search Report for corresponding EP Application No. 21190478.4-1203/3955709 dated Jan. 19, 2022 (8 pages).

* cited by examiner

*Primary Examiner* — Jeremy C Norris
(74) *Attorney, Agent, or Firm* — Jay J. Hoette; The Small Patent Law Group, LLC

(57) ABSTRACT

A circuit board includes a protective film of such a type that a mating contact slides on the protective film and rides over a pad, and is prevented from deteriorating due to attachment and detachment. A circuit board 10 includes a plate-shaped base body 40, a pad 20 formed on a surface of the base body 40 and responsible for electrical contact with a mating contact, and a protective film 30 that spreads on the surface of the base body 40 in contact with an edge of the pad 20. The edge of the pad 20 and a portion, which contacts the edge of the pad 20, of the protective film 30 respectively have heights consecutive to each other. The pad 20 contacts, by causing the mating contact that has slid in a sliding direction in contact with the protective film 30 to ride over the pad 20, the mating contact that has ridden over the pad 20.

14 Claims, 4 Drawing Sheets

CIRCUIT BOARD

CROSS REFERENCE TO RELATED APPLICATIONS

This application claims priority to JP Application No. 2020-136680, filed 2020 Aug. 13, the subject matter of which is herein incorporated by reference in its entirety.

BACKGROUND

The subject matter herein relates generally to a circuit board appropriate for a card edge connector.

A card edge connector using an electrically conductive pad formed in a circuit board as a contact that electrically contacts a mating contact provided in a connector as a mating counterpart. For example, Japanese Patent JP3894774B discloses a card edge connector in which a protective pad is formed on the side of a front end, toward which a mating contact slides in mating, of an electrically conductive pad responsible for contact with the mating contact.

A protective film called a resist is often formed in a circuit board. A pad responsible for electrical conduction is often formed in a circuit board. For example, in the case of a card edge connector, a pad responsible for electrical contact with a mating contact provided in a connector as a mating counterpart is formed. In forming the protective film in the circuit board where the pad is formed, a portion of the pad is masked to be slightly wide such that the pad is not covered with the protective film, and is then coated with a resist liquid. Accordingly, a gap is formed between an edge of the pad and the protective film. In the case of the card edge connector, in mating with the mating connector, the mating contact slides on the protective film in the circuit board and rides over the pad so that the pad and the mating contact interface each other. Accordingly, in attachment to and detachment from the mating connector, the mating contact and the circuit board may be damaged by each other without the mating contact smoothly sliding onto the pad from on the protective film or onto the protective film from on the pad due to the presence of the above-described gap. That is, when the attachment and detachment are repeated, deterioration of the mating contact and the circuit board may be promoted.

In the case of the card edge connector disclosed in the above-mentioned Japanese Patent JP3894774B, the protective pad is illustrated. However, a protective film that covers a base body of a circuit board is not illustrated.

A need remains for a circuit board that includes a protective film of such a type that a mating contact slides on the protective film and rides over the pad and is prevented from deteriorating due to attachment and detachment.

BRIEF DESCRIPTION

In one embodiment, a circuit board is provided including a plate-shaped base body, at least one pad formed on a surface of the base body and responsible for electrical contact with a mating contact, and a protective film spreading on the surface of the base body in contact with an edge of the pad.

In various embodiments, the protective film may spread in contact with the edge of the pad, whereby deterioration due to attachment and detachment is more suppressed than that in a circuit board of such a type that a gap is formed between a protective film and an edge of a pad.

In various embodiments, the edge of the pad and a portion, which contacts the edge of the pad, of the protective film may respectively have heights consecutive to each other. When the edge of the pad and the portion, which contacts the edge of the pad, of the protective film respectively may have the heights consecutive to each other, the deterioration due to attachment and detachment is further suppressed.

In various embodiments, the pad contacts, by causing the mating contact that has slid rearward in a predetermined sliding direction in contact with the protective film to ride over the pad, the mating contact that has ridden over the pad, and an edge, at a front end in the sliding direction, of the pad may linearly extend in a width direction intersecting the sliding direction. When the edge, at the front end in the sliding direction, of the pad is pointed forward, the mating contact may contact the pointed front end having a narrow width in riding over the pad, whereby the mating contact is easily damaged. On the other hand, when the edge at the front end of the pad linearly extends in the width direction intersecting the sliding direction, the damage is more suppressed, as compared with when the edge at the front end of the pad is pointed forward.

In various embodiments, the plurality of pads may be sequentially arranged with spacing in the sliding direction, and the protective film spreads on the surface of the base body in contact with both an edge at a rear end of the first pad positioned relatively in front among the plurality of pads arranged in the sliding direction and an edge at a front end of the second pad adjacent to the rear of the first pad. In the case of this structure, the damage may be suppressed even in both introduction and extraction from a state where the mating contact rides over the first pad or the second pad until a state where the mating contact rides over the other pad.

In various embodiments, a plurality of rows each including the plurality of pads sequentially arranged with spacing in the sliding direction may be arranged in a width direction intersecting the sliding direction, and the pads arranged in the two rows adjacent to each other in the width direction may be respectively formed at positions deviating from each other in the sliding direction. When the pads are respectively formed at the positions deviating from each other in the sliding direction, the pads can be more closely positioned in the width direction, as compared with when the pads are formed at the same position in the sliding direction, which may contribute to miniaturization of the circuit board.

In various embodiments, both the pad and the protective film may be respectively formed on both surfaces of the base body. When the pad and the protective film are respectively formed on both surfaces of the base body, miniaturization of the circuit board may be achieved.

In various embodiments, a front end portion on the side, on which the mating contact moves rearward in the sliding direction and first contacts the protective film, of the base body has a tapered shape that decreases in thickness toward the front, and the protective film covers the front end portion and spreads. When the front end portion has a tapered shape, and the front end portion is covered with the protective film, mating with the mating connector may be smoothed, and damage to the front end portion or the mating contact may be suppressed.

In various embodiments, the protective film may have a lower friction coefficient than that of the surface of the base body. When the protective film having a low friction coefficient is formed, smooth introduction and extraction may be performed.

In various embodiments, deterioration due to attachment and detachment (a damage to a mating contact or the circuit board) may be suppressed.

DETAILED DESCRIPTION

Figure 1:
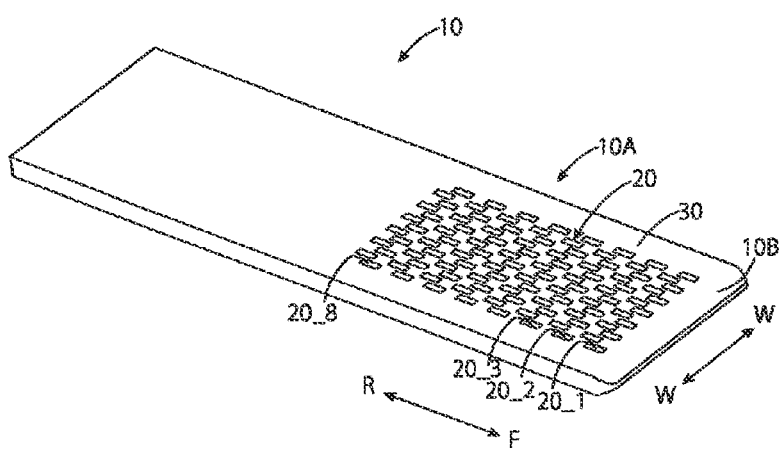
FIG. 1 is an isometric view of a circuit board according to an exemplary embodiment.
Figure 2:
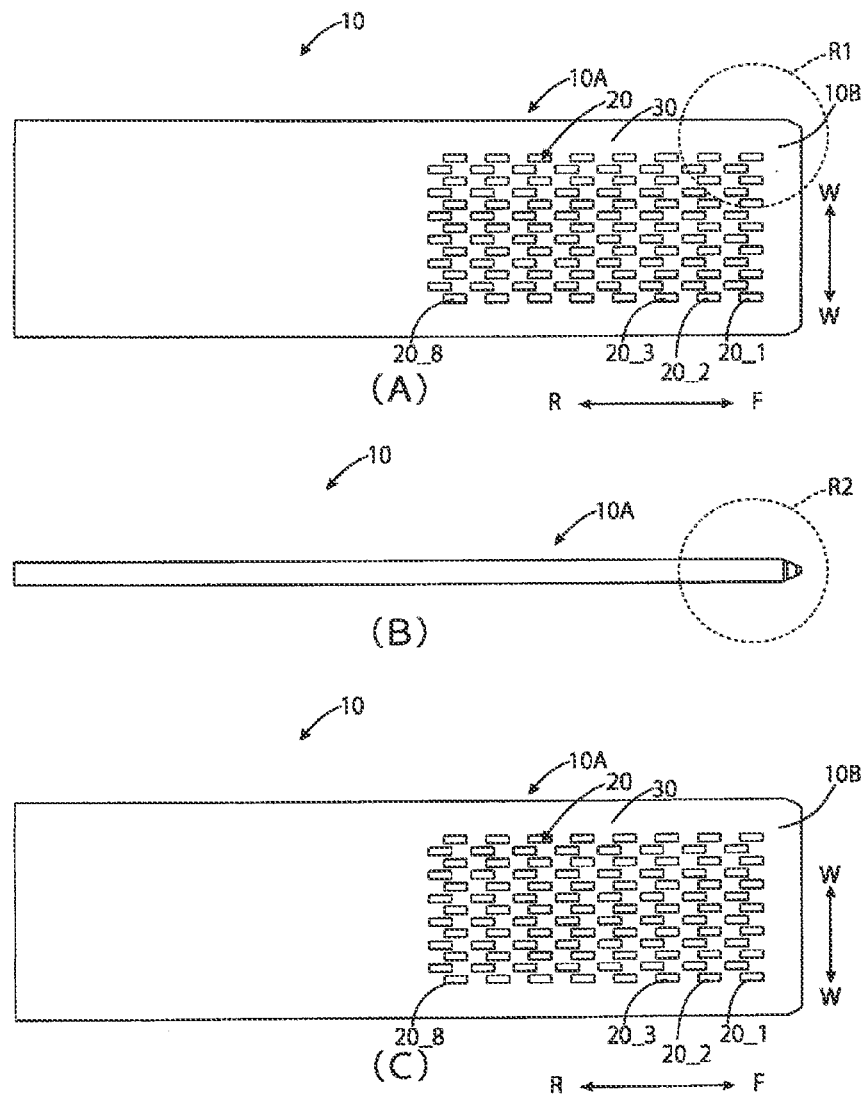
FIG. 2 is a top view (A), a side view (B), and a bottom view (C) of the circuit board in accordance with an exemplary embodiment.

FIG. 1 is an isometric view of a circuit board 10 in accordance with an exemplary embodiment. FIG. 2 is a top view (A), a side view (B), and a bottom view (C) of the circuit board 10 in accordance with an exemplary embodiment. In FIG. 1 and FIG. 2, illustration of elements other than elements characteristic of the present embodiment on the circuit board is omitted. Description of the elements the illustration of which is omitted is also omitted.

In the circuit board 10, many pads 20 are arranged on both its front surface (see FIG. 2 (A) and rear surface (see FIG. 2 (B)). Thus, when the pads 20 are formed on both the front surface and the rear surface of the circuit board 10, more pads 20 can be positioned, as compared with when pads 20 are formed on only one of the surfaces. If the number of pads 20 is the same, the circuit board 10 can be miniaturized.

The many pads 20 illustrated in FIG. 1 and FIG. 2 are pads responsible for electrical contact with a mating contact provided in a mating connector not illustrated. That is, a portion, where the pads 20 are arranged, in the circuit board 10 is used as a card edge connector 10A. An entire surface, excluding portions respectively just above the pads 20, of at least the portion used as the card edge connector 10A in the circuit board 10 is covered with a protective film called a resist.

The card edge connector 10A mates with the mating connector by being inserted into the mating connector in a direction indicated by an arrow F. The mating connector includes the same number of mating contacts as that of the pads 20 in the same arrangement as that of the pads 20 on the circuit board 10. With the card edge connector 10A completely mating with the mating connector, the mating contacts respectively remain contacting the arranged pads 20.

Here, the arrangement of the pads 20 on the circuit board 10 will be described.

A plurality of rows (13 rows in an example herein illustrated) of pads 20 are arranged in a width direction indicated by an arrow W. A plurality of (eight in the example herein illustrated) pads 20 are sequentially arranged with spacing in a direction indicated by an arrow F-R in each of the rows.

In mating with the mating connector, the card edge connector 10A is inserted into the mating connector in the direction indicated by the arrow F. At this time, for example, the mating contact, which contacts the pad 20_8 positioned in a rearmost part of the row at the time of complete mating, repeatedly contacts the pads 20, as described below, as the mating progresses. That is, the mating contact that contacts the pad 20_8 slides toward the rear indicated by an arrow R on a protective film 30, and first passes on the pad 20_1 while contacting the foremost pad 20_1. The mating contact separates from the pad 20_1 and slides on the protective film 30 again. Then, the mating contact passes on the second pad 20_2 from the front while contacting the pad 20_2. This is repeated until the mating contact finally contacts the pad 20_8 positioned in the rearmost part of the row. For example, the mating contact that contacts the second pad 20_2 from the front at the time of complete mating slides on the protective film 30 later than the mating contact that contacts any one of the third and subsequent pads 20_3, . . . , 20_8 from the front, and passes on the foremost pad 20_1 while contacting the pad 20_1. Then, the mating contact separates from the pad 20_1 and slides on the protective film 30 again. At the time of complete mating, the mating contact contacts the second pad 20_2 from the front. Thus, the mating contact corresponding to the pad 20_n positioned at the rear indicated by the arrow R sequentially contacts the pads 20_1 to 20_n-1 positioned in front of the pad 20_n and then contacts the corresponding pad 20_n. When the card edge connector 10A is extracted from the mating connector, a trajectory reverse to that at the time of mating is drawn. That is, the mating contact corresponding to the pad 20_n positioned at the rear indicated by the arrow R is extracted while sequentially contacting the pads 20_n-1 to 20_1 positioned in front of the pad 20_n.

When an arrangement of the plurality of (eight in the example herein illustrated) pads 20 arranged in the direction indicated by the arrow F-R is taken as one row, a plurality of rows (13 rows in the example herein illustrated) are arranged in the width direction indicated by the arrow W. The pads 20 respectively belonging to the rows adjacent to each other in the width direction are respectively positioned at positions deviating from each other in a sliding direction indicated by the arrow F-R. When the pads 20 are thus respectively formed at the deviating positions, a region where no pad 20 exists more spreads around each of the pads 20, as compared with when the pads 20 are formed at the same position in the sliding direction. When the region where no pad 20 exists spreads, each of the pads 20 is not easily electrically affected by the adjacent pad 20. As a result, the pads 20 can be closely positioned in the width direction. Thus, miniaturization of the circuit board is realized.

Figure 3:
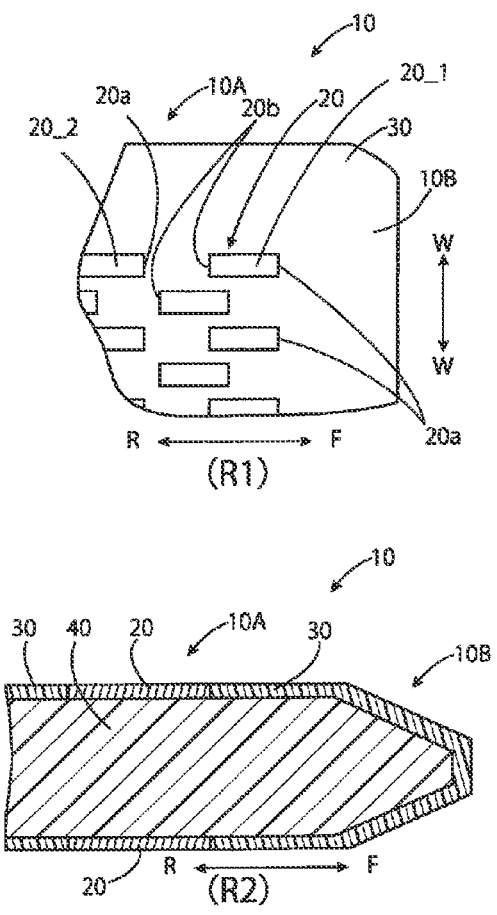
FIG. 3 is an enlarged view (R1) of a portion of a circle R1 indicated by a broken line in FIG. 2 (A) of a surface of the circuit board and an enlarged sectional view (R2) of a portion of a circle R2 indicated by a broken line in FIG. 2 (B) of the circuit board in accordance with an exemplary embodiment.

FIG. 3 is an enlarged view (R1) of a portion of a circle R1 indicated by a broken line in FIG. 2 (A) of a surface of the circuit board and an enlarged sectional view (R2) of a portion of a circle R2 indicted by a broken line in FIG. 2 (B) of the circuit board. Although FIG. 2 (B) is a side view of the circuit board, FIG. 3 (R2) is a cross sectional view of a portion corresponding to the portion of the circle R2.

As illustrated in FIG. 3 (R1), the pad 20 in the present embodiment has a substantially rectangular shape. An edge 20a, at a front end in the sliding direction indicated by the arrow F, of each of the pads 20 linearly extends in the width direction indicated by the arrow W.

When the edge at the front end in the sliding direction of the pad is pointed forward, the mating contact that has slid contacts the pointed front end having a narrow width in riding over the pad 20, whereby the mating contact is easily damaged. On the other hand, when the edge at the front end of the pad 20 linearly extends in the width direction intersecting the sliding direction, as in the present embodiment, a damage is more suppressed, as compared with when the edge at the front end of the pad is pointed forward.

The protective film 30 contacts the edge of each of the pads 20 over its circumference without a gap being formed between the edge and itself, and spreads to a surface (both a front surface and a rear surface) of a plate-shaped base body 40. Here, the two pads 20 adjacent to each other in the sliding direction indicated by the arrow F, e.g., the first pad 20_1 and the second pad 20_2 illustrated in FIG. 3, are paid attention to as a specific example. The protective film 30 spreads while contacting the edge of each of the pads 20 over the circumference. Accordingly, the protective film 30 contacts both an edge 20b at a rear end of the first pad 20_1 and an edge 20a at a front end of the second pad 20_2, and spreads on the base body 40. In the case of this structure, a damage to the mating contact due to introduction and extraction from a state where the mating contact rides over one of the pads 20 (the first pad 20_1 or the second pad 20_2) until a state where the mating contact rides over the other pad 20 is suppressed. In the present embodiment, this structure is consecutive for the eight pads 20 arranged in the sliding direction and the protective film 30 that fills a space among the pads 20, illustrated in FIG. 1 or FIG. 2. Therefore, in the present embodiment, a damage to the mating contact due to introduction and extraction into and from the mating connector is suppressed.

To form the protective film 30 that contacts the edge of each of the pads 20 without a gap being formed between the edge of the pad 20 and itself, the following processes, for example, are adopted. That is, a protective film material is applied to cover an entire surface of the base body 40 on which the pads 20 are formed or the edge of each of the pads 20. Then, buffing is performed to finish a surface of the protective film material to be flat. Accordingly, the protective film 30, which contacts the edge of each of the pads 20 without a gap being formed between the edge of the pad 20 and itself, can be formed.

For the base body 40, a front end portion 10B on the side, on which the mating contact moves rearward in the sliding direction (in the direction indicated by the arrow R) and first contacts the protective film 30, of the base body 40 has a tapered shape that decreases in thickness toward the front (in the direction indicated by the arrow F) in the present embodiment. The protective film 30 covers the front end portion 10B and spreads.

Thus, the front end portion 10B of the base body 40 has a tapered shape. When the front end portion 10B is covered with the protective film 30, mating with the mating connector becomes smooth, and a damage to the mating contact and the circuit board is suppressed.

Further, in the present embodiment, the protective film 30 has a lower friction coefficient than that of the surface of the base body 40. The protective film 30 having a low friction coefficient is formed so that smooth introduction and extraction are performed.

As a material forming the protective film 30, resin having a low friction coefficient or a glass-based coating agent, for example, can be adopted in addition to a resist generally adopted to protect the surface of the circuit board.

Figure 4:
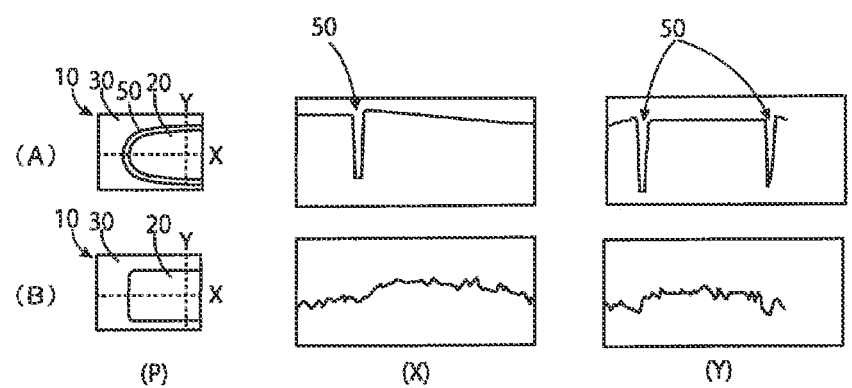
FIG. 4 is a diagram illustrating a measurement result of a height distribution of the surface of the circuit board in accordance with an exemplary embodiment.

FIG. 4 is a diagram illustrating a measurement result of a height distribution of the surface of the circuit board. Here, FIG. 4 (A) illustrates a comparative example to be compared with the disclosed subject matter, and FIG. 4 (B) illustrates an example of the disclosed subject matter.

In the comparative example illustrated in FIG. 4 (A), a groove 50 to which the base body 40 (see FIG. 3 (R2)) is almost exposed exists between the pad 20 and the protective film 30 on the circuit board 10, as indicated in (P) of (A) at the upper left of FIG. 4. If the base body 40 is covered with the protective film 30, the pad 20 has been conventionally covered with a slightly larger mask than the pad 20, and is coated with a material for the protective film 30 so as to expose an entire area of the pad 20 from the protective film 30, as illustrated in FIG. 4 (A). Accordingly, the protective film 30 slightly spaced apart from the edge of the pad 20 is formed, and the groove 50 is formed between the pad 20 and the protective film 30. A shape of the pad 20 is a shape tapered in the sliding direction.

On the other hand, in the example illustrated in FIG. 4, the protective film 30 on the circuit board 10 contacts the edge of the pad 20, and no groove exists therebetween, as indicated by (P) of (B) at the lower left of FIG. 4. In this structure, the pad 20 is covered with a slightly smaller mask than the pad 20, and is coated with a material for the protective film 30, for example, as described above. Accordingly, a protective film 30 that overlaps even the edge of the pad 20 is formed once. Then, buffing is performed such that a surface of the protective film 30 becomes flat. As a result, a portion, which overlaps the edge of the pad 20, of the protective film 30 is scraped off, the pad 20 is exposed to its edge, and the protective film 30 that spreads in contact with the edge is formed. In the present embodiment, the pad 20 has a substantially rectangular shape, and the edge extending in the width direction is formed.

FIG. 4 (X) is a diagram illustrating a height distribution of the surface of the circuit board 10 along a broken line X transversely extending for each of (A) and (B) in FIG. 4 (P).

FIG. 4 (Y) is a diagram illustrating a height distribution of the surface of the circuit board 10 along a broken line Y longitudinally extending for each of (A) and (B) in FIG. 4 (P).

As can be seen from the drawings, in the comparative example illustrated in FIG. 4 (A), a deep groove 50 is formed. Accordingly, when the mating connector that has slid passes through the groove 50, the circuit board 10 is damaged. When this is repeated, there may occur such malfunctions that the surface of the circuit board 10 is scraped off and the edge of the pad 20 is rolled up, for example (in turn, also including malfunctions such as a damage to and a wear of the mating contact that slides). On the other hand, in the example illustrated in FIG. 4 (B), no groove 50 is formed, and the edge of the pad 20 and a portion, which contacts the edge of the pad 20, of the protective film 30 respectively have heights consecutive to each other. Accordingly, even if the mating contact moves across the pad 20 and the protective film 30, a damage to be received by the mating contact or a damage to be given to the circuit board 10 may be significantly small. Accordingly, in the present embodiment, a circuit board having a high reliability in which the possibility of occurrence of the above-described malfunctions has been suppressed is realized.

Here, the card edge connector 10A in which the plurality of pads 20 are arranged in a two-dimensional manner has been taken and described, as illustrated in FIG. 1 and FIG. 2. Note that the disclosed subject matter is also applicable to a card edge connector of such a type that pads 20 are arranged in only one row in a width direction.

The embodiments described herein are not limited to the card edge connector. For example, various embodiments may also applicable to a circuit board of such a type that a mating contact arranged in a two-dimensional manner approaches a circuit board from above and is pressed against pads arranged in a two-dimensional manner on the circuit board while slightly sliding.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A circuit board, comprising:
a plate-shaped base body:
a plurality of pads formed on a surface of the base body and responsible for electrical contact with corresponding mating contacts, the plurality of pads being sequentially arranged with spacing in a sliding direction; and
a protective film on the base body, the protective film being in contact with an edge of each pad and spreading on the surface of the base body;
wherein the protective film is in contact with both an edge at a rear end of the first pad positioned relatively in front among the plurality of pads arranged in the sliding direction and an edge at a front end of the second pad adjacent to the rear of the first pad and spreads on the surface of the base body.

2. The circuit board of claim 1, wherein the edge of the pad and a portion of the protective film that is in contact with the edge respectively have heights continuous with each other.

3. The circuit board of claim 1, wherein:
the protective film is adapted to cause the mating contact sliding rearward in a predetermined sliding direction in contact with the protective film to ride over the pad and to contact the pad that is ridden over, and
an edge of the pad at a front end thereof in the sliding direction extends linearly in a width direction intersecting the sliding direction.

4. The circuit board of claim 1, wherein:
a plurality of rows including the plurality of pads sequentially arranged with spacing in the sliding direction are arranged in a width direction intersecting the sliding direction, and
the pads arranged in the two rows adjacent to each other in the width direction are respectively formed at positions deviating from each other in the sliding direction.

5. The circuit board of claim 1, wherein the pads and the protective film are respectively formed on both surfaces of the base body.

6. The circuit board of claim 1, wherein:
a front end portion on the side of the base body on which the mating contact moves rearward in the sliding direction and first contacts the protective film, has a tapered shape that decreases in thickness toward the front, and
the protective film covers the front end portion and spreads.

7. The circuit board of claim 1, wherein the protective film has a lower friction coefficient than that of the surface of the base body.

8. A circuit board, comprising:
a plate-shaped base body:
a plurality of pads formed on a surface of the base body and responsible for electrical contact with corresponding mating contacts, the plurality of pads sequentially arranged with spacing in a sliding direction, the plurality of pads being arranged in a plurality of rows arranged in a width direction intersecting the sliding direction, wherein the pads arranged in two rows adjacent to each other in the width direction are respectively formed at positions deviating from each other in the sliding direction; and
a protective film on the base body, the protective film being in contact with an edge of each pad and spreading on the surface of the base body.

9. The circuit board of claim 8, wherein the edge of the pad and a portion of the protective film that is in contact with the edge respectively have heights continuous with each other.

10. The circuit board of claim 8, wherein:
the protective film is adapted to cause the mating contact sliding rearward in a predetermined sliding direction in contact with the protective film to ride over the pad and to contact the pad that is ridden over, and
an edge of the pad at a front end thereof in the sliding direction extends linearly in a width direction intersecting the sliding direction.

11. The circuit board of claim 8, wherein the protective film is in contact with both an edge at a rear end of the first pad positioned relatively in front among the plurality of pads arranged in the sliding direction and an edge at a front end of the second pad adjacent to the rear of the first pad and spreads on the surface of the base body.

12. The circuit board of claim 8, wherein the pads and the protective film are respectively formed on both surfaces of the base body.

13. The circuit board of claim 8, wherein:
a front end portion on the side of the base body on which the mating contact moves rearward in the sliding direction and first contacts the protective film, has a tapered shape that decreases in thickness toward the front, and
the protective film covers the front end portion and spreads.

14. The circuit board of claim 8, wherein the protective film has a lower friction coefficient than that of the surface of the base body.

* * * * *